United States Patent [19]

Deguchi

[11] Patent Number: 5,228,948

[45] Date of Patent: Jul. 20, 1993

[54] METHOD FOR FABRICATING RECRYSTALLIZED SEMICONDUCTOR FILM

[75] Inventor: Mikio Deguchi, Itami, Japan

[73] Assignee: Mitsubishi Denki Kabushiki Kaisha, Tokyo, Japan

[21] Appl. No.: 802,481

[22] Filed: Dec. 5, 1991

[30] Foreign Application Priority Data

Jan. 29, 1991 [JP] Japan ................................. 3-31799

[51] Int. Cl.$^5$ ............................................ C30B 13/22
[52] U.S. Cl. ................................... 156/607; 156/603; 156/610; 437/84
[58] Field of Search ........................ 156/603, 607, 610; 437/84

[56] References Cited

U.S. PATENT DOCUMENTS 4,321,099  3/1982  Stirn et al. ........................... 437/109
4,784,723 11/1988  Sakurai ................................ 156/620.73
4,822,752  4/1989  Sugahara et al. ..................... 437/84

FOREIGN PATENT DOCUMENTS 59-119829  7/1984  Japan .
63-88819   4/1988  Japan .
283915     3/1990  Japan .

OTHER PUBLICATIONS

Fukami et al., "Improvement In Crystalline Quality of Silicon On Fused Silica By Zone Melting Recrystallization", Electron Community Socciety Thesis, 86/9 vol. J69-C, pp. 1089-1095.

Fan et al., "Graphite-Strip-Heater Zone-Melting Recrystallization of Si Films", Journal of Crystal Growth 63 (1983), pp. 453, 477-478.

Geis et al., "Zone-Melting Recrystallization of Encapsulated Silicon Films on SiO$_2$ Morphology and Crystallography", Applied Physics Letters, vol. 40, No. 2, 1982, pp. 158-160.

Stultz et al., "Arc Lamp Zone Melting And Recrystallization of Si Films on Oxidized Silicon Substrates", Applied Physics Letters, vol. 41, No. 9, 1982, pp. 824-826.

Primary Examiner—Robert Kunemund
Assistant Examiner—Felisa Garrett
Attorney, Agent, or Firm—Leydig, Voit & Mayer

[57] ABSTRACT

A method for fabricating a recrystallized semiconductor film includes forming a polycrystalline or amorphous semiconductor film on a base having a melting point or softening temperature lower than the melting point of the semiconductor film, heating the base to melt it with a first heater, and melting the semiconductor film with a second heater and recrystallizing the semiconductor film while the base is molten. Thereby, generation of stress in the semiconductor film is prevented or reduced and the planarity of the semiconductor film is not damaged by distortion of the substrate and the temperature in the semiconductor film is uniform at the time of recrystallization. As a result, a recrystallized film with good crystallinity is obtained.

12 Claims, 3 Drawing Sheets

METHOD FOR FABRICATING RECRYSTALLIZED SEMICONDUCTOR FILM

FIELD OF THE INVENTION

The present invention relates to a method for fabricating a device including a semiconductor film and, more particularly, to a method for fabricating a semiconductor device including a recrystallized semiconductor film.

BACKGROUND OF THE INVENTION

FIG. 3 is a schematic sectional view illustrating a conventional method for fabricating a device using a semiconductor film. In FIG. 3, reference numeral 1 designates a semiconductor film, reference numeral 3 designates a substrate, reference numeral 10 designates an isolation film, reference numeral 11 designates a encapsulation film. The semiconductor film 1 comprises, for example polycrystalline silicon or amorphous silicon, which is formed by a method such as thermal decomposition or plasma decomposition of gases containing silicon, such as silane or dichlorosilane. The substrate 3 is formed of the same material as that of the semiconductor film 1 or a material whose melting point or softening temperature is higher than the melting point of the semiconductor film 1. For example, as the material of the substrate 3, a crystalline silicon wafer, sapphire, quartz, a ceramic or the like is used. When the semiconductor film 1 is silicon and the substrate 3 is also silicon, the isolation film 10 is inserted between the semiconductor film 1 and the substrate 3 in order to electrically insulate and to structurally and thermally isolate the semiconductor film 1 from the substrate 3. In most cases, silicon dioxide is used as the isolation film 10. Even when the substrate 3 is formed of a material different from that of the semiconductor film 1, if a material with high thermal conductivity such as a ceramic is used, an isolation film 10 with low thermal conductivity such as silicon dioxide film is generally inserted between them to thermally isolate the semiconductor film 1 from the substrate 3. In addition, the isolation film 10 prevents a component of the substrate 3 or an impurity contained in the substrate 3 from diffusing into the semiconductor film 1 so as not to degrade the performance of the semiconductor device. The silicon dioxide film is also generally used as the encapsulation film 11 like the isolation film 10. The encapsulation film 11 protects the surface of the semiconductor film 1 from the atmosphere and mechanically maintains the morphology of the semiconductor film 1.

Next, operation thereof will be described. The whole sample with the above structure is heated up at a temperature close to the melting point of the semiconductor film 1, which is approximately 1200° to 1300° C. if the semiconductor film 1 is silicon because the melting point of silicon is 1414° C. Although the heating means is not shown in FIG. 3, heating with an infrared lamp heater or a carbon heater, radio frequency induction heating or the like is used in most cases. In this state, a part of the sample is further heated to melt a part of the semiconductor film 1. As the partial heating means, an infrared lamp heater, carbon heater or the like is also generally used. Then, the partially heated region is moved to sequentially melt the semiconductor film 1 from one end of the sample and then it is solidified, that is, recrystallized again from the rear region of the partially heated part. When the semiconductor film 1 solidifies, since solidification following the crystalline orientation of the rear part which has been already recrystallized, the recrystallized seniconductor film 1 consists of large grains in which the crystalline orientation is uniform regardless of crystallinity of the semiconductor film 1 before being melted, even if the semiconductor film 1 before being melted is noncrystalline. In addition, a monocrystalline semiconductor film 1 can be obtained by bringing a part of the semiconductor film 1 into contact with a semiconductor monocrystal formed of the same material as that of the semiconductor film 1 and then solidifying it so as to follow the crystalline orientation of the semiconductor monocrystal when the semiconductor film 1 is recrystallized.

Since the semiconductor film 1 is sandwiched between the isolation film 10 and the encapsulation film 11, thermal energy applied to the semiconductor film 1 by the partially heating means is confined in the semiconductor film 1. Therefore, the thermal energy applied to the semiconductor film 1 can be effectively used to melt it and thus the substrate 3 is prevented from being superheated. In addition, when the semiconductor film 1 is melted and becomes liquid, since the encapsulation film 11 covers the semiconductor film 1, the semiconductor film 1 is prevented from agglomerating like dew because of surface tension and the configuration of the film 1 is prevented from changing during the recrystallization. When the semiconductor film 1 is silicon, silicon dioxide film is generally used as the encapsulation film 11. However, since the interface energy between the melted silicon and the silicon dioxide film is large and the silicon dioxide film is softened at the melting temperature of silicon, the configuration of the semiconductor film 1 can not be effectively prevented from changing only by a silicon dioxide film in some cases. In this case, the encapsulation film 11 is a silicon nitride film laminated on a silicon dioxide film. By using the silicon nitride film, wetting between melted silicon and the encapsulation film 11 is improved and the forces which cause agglomeration are reduced. In addition, the mechanical strength of the encapsulation film 11 is reinforced, whereby ability to prevent the configuration of the semiconductor film 1 from changing is enhanced by a silicon nitride film.

However, according to the conventional method for fabricating the semiconductor device, since the material whose melting point or softening temperature is as same as or higher than the melting point of the semiconductor film 1 is used for the substrate 3, the substrate 3 is in a solid state when the semiconductor film 1 is melted and recrystallized. Therefore, thermal stress stored in the semiconductor film 1 remains in a crystalline semiconductor film 1 when the semiconductor film 1 is solidified, which influences the characteristics of the semiconductor device fabricated using the semiconductor film 1. More specifically, when the material of the substrate 3 is different from that of the semiconductor film 1, because of the difference of the thermal expansion coefficients between the semiconductor film 1 and the substrate 3, stress corresponding to the distortion of $(\alpha s - \alpha b) \times (Tm, s - Tr)$ remains in the semiconductor film 1, where $Tm, s$ is the temperature at which the semiconductor film 1 is melted and recrystallized, $\alpha s$ is an average thermal expansion coefficient of the semiconductor film 1, $\alpha b$ is an average thermal expansion coefficient of the substrate 3 and $Tr$ is the room temperature.

Even when the substrate 3 is formed of the same material as that of the semiconductor film 1, since the semiconductor film 1 is usually thermally isolated from the substrate 3 by the isolation film 10, the temperature Ta of the substrate 3 is lower than the melting point Tm, s of the semiconductor film 1 at the moment the semiconductor film 1 is melted and solidified. Therefore, in this case also, stress corresponding to the distortion of $\alpha s \times (Tm, s - Ta)$ remains in the semiconductor film 1. In addition, if the semiconductor film 1 is silicon, when silicon is solidified, its volume is expanded from that in a melted state by 9%. Therefore, when silicon is solidified on the solid substrate 3 or the isolation film 10 attached thereon, stress corresponding to volume expansion at the time of solidification is inevitable.

FIG. 4 is a view showing a method for manufacturing a semiconductor device disclosed in Japanese Published Patent Application No. 63-88819. In FIG. 4, reference numeral 100 designates an insulating film such as a silicon dioxide film or a silicon nitride film disposed on a surface of the substrate 3, reference numeral 22 designates a thin film of Ge or the like with the melting point lower than that of the semiconductor film 1 which is silicon, and reference numerals 111 and 112 designate films disposed on a part of the encapsulation film 11 in order to reduce the power of the energy beam applied to the semiconductor film 1. In this example, a thin film 22 with a thickness of 400 to 800 nm whose melting point is lower than that of the semiconductor film 1 is formed between the semiconductor film 1 and the substrate 3. When the semiconductor film 1 is partially heated melted and recrystallized by a heating means such as an electron beam, the semiconductor film 1 is solidified on the thin film 22 by melting the semiconductor film 1 and the thin film 22 simultaneously, with the result that stress caused by thermal expansion is prevented from being generated in the semiconductor film 1. More specifically, the thin film 22 is melted between the temperature Tm, s at which the semiconductor film 1 is recrystallized and the temperature Tm, b, where Tm, b is the melting point of the thin film 22. Therefore, stress caused by a change of volume at the time of solidification of the semiconductor film 1 is relieved and stress caused by thermal expansion of the semiconductor film 1 at the temperature from Tm, s to Tm, b is not generated, so that the stress remaining in the semiconductor film 1 is reduced to that corresponding to the distortion of $(s-b) \times (Tm, b - Tr)$ (Tm, $b < Tm$, s).

However, in this conventional example, since the thin film 22 with the low melting point is melted by heating with the energy beam for the melting of the semiconductor film 1, the melted part of the thin film 22 is limited to the vicinity of the melted part of the semiconductor film 1 and the thin film 22 is also melted and solidified as the semiconductor film 1 is melted and solidified. Accordingly, thermal strain in the thin film 22 itself is generated, which applies stress to the semiconductor film 1.

This arrangement has been devised mainly with a view to forming the thin film crystalline silicon on the insulating film 100. Such a structure is called SOI (Silicon On Insulator), which has been actively studied as a fundamental structure for implementing a three dimensional integrated circuit, that is, a device with the structure in which plane integrated circuits are stacked by forming a crystalline silicon thin film on a surface of the silicon substrate 3 with the integrated circuit thereon and further forming the integrated circuit thereon and then connecting the respective integrated circuits to each other by wiring. However, in this case, the thin film 22 formed of a material with the low melting point such as Ge is disposed between the substrate 3 and the semiconductor film 1 and the thin film 22 still remains between them after the semiconductor film 1 is recrystallized. Therefore, when the three dimensional integrated circuit is implemented, it is necessary to wire the semiconductor film 1 to the substrate 3 through the thin film 22 between them. However, when a conductive material such as Ge is used for the thin film 22, since the wirings is short-circuited, the semiconductor film 1 can not be properly electrically connected to the substrate 3, so that it is difficult to implement the three dimensional integrated circuit. In addition, since the melting point of the thin film 22 is low, the thin film 22 is melted during the fabrication process for forming the integrated circuit on the semiconductor film 1 at a temperature above the melting point of the thin film 22. Thus, the force holding the semiconductor film 1 on the substrate 3 is lost and the position of the semiconductor film 1 on the substrate 3 could be shifted. As a result, it becomes difficult to form wiring correctly between the semiconductor film 1 and the substrate 3, so that it is difficult to form the three dimensional integrated circuit in this case also. As described above, although the conventional example shown above is effective in principle as far as recrystallization of the semiconductor film 1 is concerned, in the actual application as fabrication technique, there are many problems to be solved.

In addition, since the semiconductor film 1 is disposed on the substrate 3 in the above conventional examples, the substrate 3 is distorted because of the stress generated after melting and recrystallization of the semiconductor film 1 and then the planarity of the semiconductor film 1 is damaged. In addition, since the melting and recrystallization of the semiconductor film 1 is performed on substrate 3, the size of the semiconductor film 1 is limited to the size of the substrate and a semiconductor film 1 having a large area can not be recrystallized.

As described above, according to the conventional method for fabricating the semiconductor device, stress is generated in the semiconductor film by its melting and recrystallization, whereby the substrate is distorted and the planarity of the semiconductor film can not be maintained. Even when generation of the stress can be reduced, it is difficult to actually form the semiconductor device by the above method. In addition, the size of the semiconductor film is limited to the size of the substrate, so that a large area semiconductor film can not be recrystallized.

SUMMARY OF THE INVENTION

The present invention was made to solve the above problems and it is an object of the present invention to provide a method for fabricating a practical semiconductor device using semiconductor films, in which the generation of stress in a semiconductor film is prevented or reduced and the semiconductor film is melted and recrystallized over a large area while planarity is maintained.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a method for fabricating a semiconductor device according to the present invention, a semiconductor film comprising a semiconductor material is formed on a base having melting point or softening temperature is lower than the melting point of the semiconductor material, the base is melted by first heating means and then the semiconductor film is melted and recrystallized by second heating means on the base in a melted state. In addition, the semiconductor film is formed using an isolation film to prevent a component of the base or impurities contained in the base from diffusing into the semiconductor film. In addition, the semiconductor film is recrystallized using a splint plate to prevent the configuration of the semiconductor film from changing.

According to a method for fabricating a semiconductor device according to the present invention, since the semiconductor film is melted and recrystallized on the base, generation of stress in the semiconductor film is prevented or reduced and the planarity of the semiconductor film is maintained, whereby temperature uniformity in the semiconductor film at the time of recrystallization is improved. As a result, a recrystallized film with good crystallinity can be obtained. In addition, it is possible to melt and recrystallize the semiconductor film over a large area. In addition, it is possible to prevent a component of the base or impurities contained in the base from diffusing into the semiconductor film by interposing the isolation film between the base and the semiconductor film. In addition, it is possible to improve planarity by forming a splint plate on the semiconductor film.

DETAILED DESCRIPTION OF THE PREFERRED EMBODIMENTS

Figure 1A:
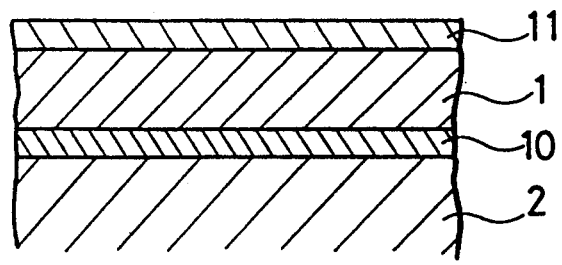
FIGS. 1(a) to 1(c) are schematic sectional views showing a method for fabricating a semiconductor device in accordance with a first embodiment of the present invention.
Figure 1B:
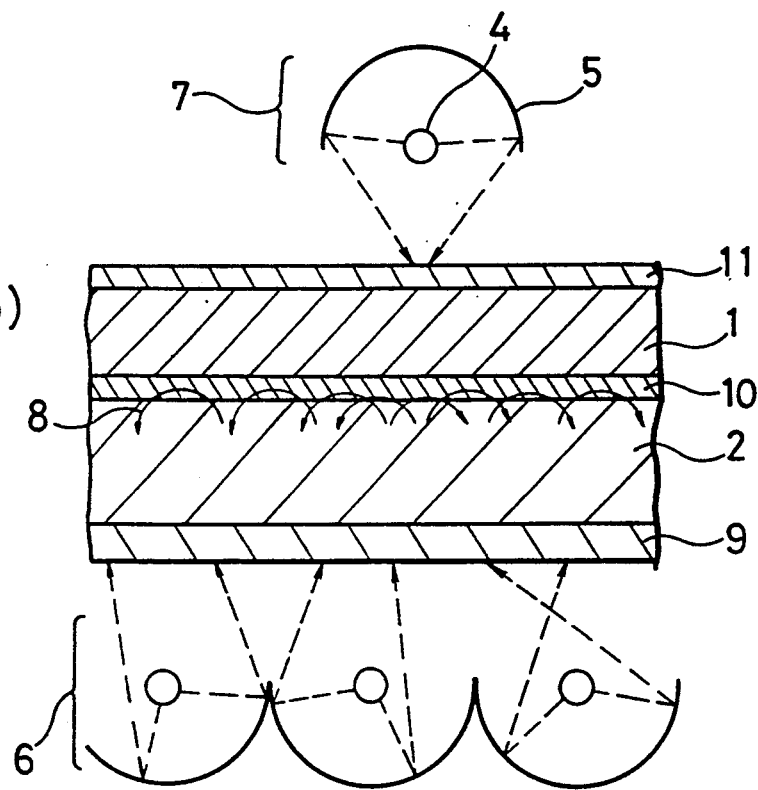
Figure 1C:
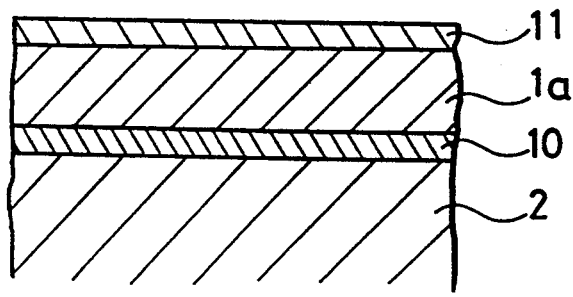

FIGS. 1(a) to 1(c) are schematic sectional views showing a method for fabricating a semiconductor device in accordance with an embodiment of the present invention. In FIGS. 1(a)–1(c), reference numeral 1a designates a recrystallized semiconductor film, reference numeral 1 designates a semiconductor film, reference numeral 2 designates a base, reference numeral 10 designates an isolation film and reference numeral 11 designates an encapsulation film. Similar to the conventional example, the semiconductor film 1 comprises polycrystalline silicon or amorphous silicon, which is formed by a method such as thermal decomposition or plasma decomposition of gases comprising silicon, such as silane or dichlorosilane. The base 2 comprises a material whose melting point or softening temperature is lower than that of the semiconductor film 1. In addition, the base material must not boil nor generate gases at a temperature when the semiconductor film 1 is melted. For example, when the semiconductor film 1 comprises silicon (the melting point is 1414° C.), as the material of the base 2, a metal such as aluminum (the melting point is 660° C. and the boiling point is 2467° C), antimony (the melting point is 630° C. and the boiling point is 1635° C.), gallium (the melting point is 30° C. and the boiling point is 2403° C.), gold (the melting point is 1064° C. and the boiling point is 2966° C.), silver (the melting point is 962° C. and the boiling point is 2212° C.), germanium (the melting point is 958° C. and the boiling point is 2700° C.), tin (the melting point is 232° C. and the boiling point is 2270° C.), copper (the melting point is 1084° C. and the boiling point is 2595° C.), lead (the melting point is 327° C. and the boiling point is 1744° C.) or an alloy of them, or a compound such as calcium chloride (the melting point is 772° C. and the boiling point is 1600° C. or more) or potassium chloride (the melting point is 776° C. and the boiling point is 1500° C.), or glass (the softening temperature is approximately 500° to 800° C.), etc., can be used.

Although the semiconductor film 1 may be directly formed on the base 2, the isolation film 10 may be disposed between the semiconductor film 1 and the base 2 as shown in FIG. 1(a) in order to thermally isolate the semiconductor film 1 from the base 2. In addition, when it is undesirable that a component of the base 2 or impurities contained therein diffuse into the semiconductor film 1, the isolation film 10 is used. In addition, the isolation film 10 also prevents the configuration of the semiconductor film 1 from changing when it is melted. As the isolation film 10, a silicon dioxide film or the like can be used. Similar to the isolation film 10, as the encapsulation film 11, a silicon dioxide film can be also used. The encapsulation film 11 protects the surface of the semiconductor film 1 from the atmosphere and also mechanically maintains the surface morphology of the semiconductor film 1.

Next, operation will be described. First, as shown in FIG. 1(b), the base 2 is heated to the melting point or the softening temperature or more by a first heating means 6 such as electrical resistance heating or the radio frequency induction heating until it is melted over the whole region where the semiconductor film 1 is formed. In a case where the heating by the first heating means 6 is performed from the opposite side of the semiconductor film 1 on the base 2, since the whole of the base 2 shows fluidity, a container or a bathtub 9 or another means to maintain the base 2 is necessary to prevent the base 2 from flowing and the configuration of the semiconductor film 1 from being damaged. Alternatively, in a case where heating by the first heating means 6 is performed from the side of the semiconductor film 1, the part of the base 2 to be melted or softened can be limited to the interface region near under the semiconductor film 1 or the isolation film 10. In either case, the base 2 under the semiconductor film 1 should be heated so that the whole surface of the region where the semiconductor film 1 is formed is melted. Then, as shown in FIG. 1(b), the semiconductor film 1 is heated by the second heating means 7 such as a carbon heater or an infrared lamp heater, to melted and recrystallized, and the melted region is moved to sequentially melt and recrystallize the semiconductor film 1 according to the movement of the second heating means. In this embodiment described in FIG. 1, the second heating means consists of a infrared lamp heater 4 and a cylindrical mirror 5.

Figure 3:
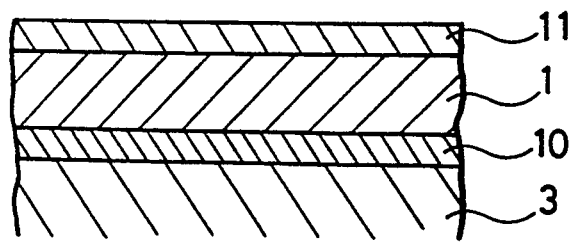
FIG. 3 is a schematic sectional view illustrating a method for fabricating a semiconductor device in accordance with a conventional example.
Figure 4:
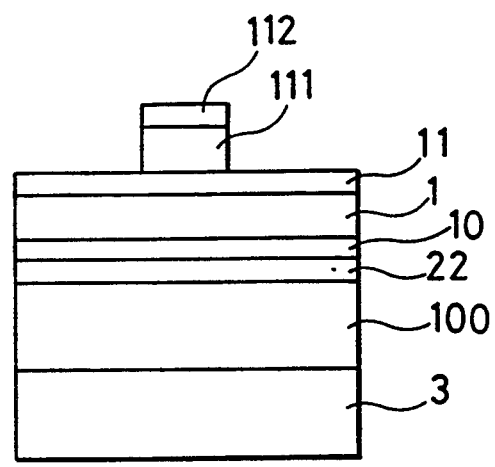
FIG. 4 is a schematic sectional view illustrating a method for fabricating a semiconductor device in accordance with another conventional example.

At this time, since at least the interface region of the base 2 near under the semiconductor film 1 or the isolation film 10 is melted or softened and becomes fluid, even when the semiconductor film 1 is formed of a material whose volume changes at the time of solidification such as silicon, the semiconductor film 1 can change its volume without causing stress by the same principle described in the conventional example in FIG. 3. At this time, since the base 2 is melted not only in the vicinity of the melted part of the semiconductor film 1 heated by the second heating means 7 but also the whole surface of the region where the semiconductor film 1 is formed, stress caused by melting and solidifying of the base 2 on which the semiconductor film 1 is formed is not generated unlike the conventional example. Even when the isolation film 10 is present mechanical strength of the isolation film 10 is not too strong so that stress is not generated in the semiconductor film 1, the function of the base 2 in a fluid state relaxing the stress in the semiconductor film 1 is not spoiled by insertion of the isolation film 10. In this case, the thickness of the isolation film 10 should be thin compared with the thickness of the semiconductor film 1, or a silicon dioxide film should be used for the isolation film 10. When the semiconductor film 1 is formed of silicon and the isolation film 10 is formed of the silicon dioxide film, since the silicon dioxide film does not become a fluid like the base 2 but is plastic at a temperature where the silicon is melted, it can be reformed so as to absorb the volume expansion of silicon at the time of solidification of the silicon, whereby the stress is relaxed.

In addition, since the base 2 under the semiconductor film 1 is in a fluid state, the semiconductor film 1 is on a horizontal and static liquid surface of the base 2, so that the semiconductor film 1 is kept flat. As a result, there is no distortion of the substrate by stress generated by melting and recrystallizing of the semiconductor film 1 and the planarity of the semiconductor film 1 is maintained in this embodiment of the present invention unlike in the conventional example. When the semiconductor film 1 is heated and melted by the second heating means 7 melted, since the base 2 under the semiconductor film 1 is also partially heated, convection 8 occurs in the melted base 2. Since the convention currents moves towards the heated part of the semiconductor film 1 or the isolation film 10 as shown in FIG. 1(b) the planarity of the semiconductor film 1 is improved by the above stretching force and, in addition, the uniformity of the temperature around the partially heated region is improved by the convection. As a result, crystalline defects caused by temperature nonuniformity at the time of recrystallization are reduced and the crystallinity of the melted and recrystallized semiconductor film 1a is improved. The semiconductor device after melting and recrystallization is shown in FIG. 1(c).

As described above, according to the first embodiment of the present invention, since the semiconductor film 1 is melted and recrystallized on the base 2 comprising a material whose melting point or softening temperature is lower than that of the semiconductor material forming the semiconductor film 1, generation of stress in the semiconductor film is prevented or reduced and then planarity of the semiconductor film 1 is not damaged by distortion of the substrate, whereby the temperature in the semiconductor film 1 is uniform at the time of recrystallization. As a result, the recrystallized film 1a with good crystallinity can be obtained. In addition, it is possible to melt and recrystallize the semiconductor film 1 over a large area not limited by the size of the substrate.

Figure 2:
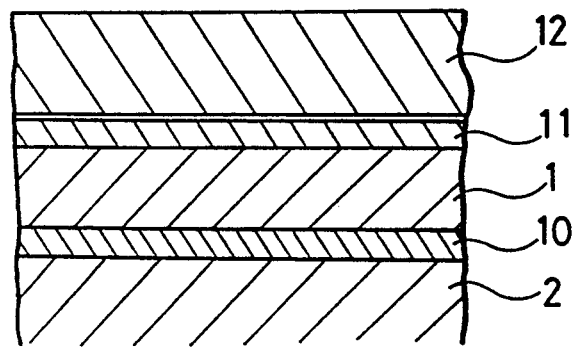
FIG. 2 is a schematic sectional view illustrating a method for fabricating a semiconductor device in accordance with another embodiment of the present invention.

Next, another embodiment of the present invention will be described hereinafter. FIG. 2 is a schematic sectional view showing a method for fabricating a semiconductor device in accordance with another embodiment of the present invention. In FIG. 2, reference numeral 12 designates a splint plate.

Next, operation thereof will be described. When a free liquid surface of the melted base 2 in a fluid state is rippled or disturbed by an external disturbance such as mechanical vibrations at the time of recrystallization of the semiconductor film 1, the configuration of the semiconductor film 1 is damaged, that damage can be prevented by pressing the semiconductor film 1 with the splint plate 12 as shown in FIG. 3. If the splint plate 12 is formed of a transparent material such as quartz, sapphire, and translucent alumina and a optical heating means such as an infrared lamp heater is used for heating the semiconductor film 1, even when the semiconductor film 1 is covered with the splint plate 12, the semiconductor film 1 can be effectively heated. In addition, the surface of the splint plate 12 may be embossed and the semiconductor film 1 may be molded by the splint plate 12 when the semiconductor film 1 is melted. As shown in FIG. 2, the semiconductor film may be pressed by the splint plate 12 through the encapsulation film 11 or an antiadhesion agent may be applied to the interface between the pressure plate 12 and the semiconductor films 1 so that the semiconductor film 1 does not adhere to the splint plate 12 doing melting and recrystallization. Silicon nitride, silicon carbide, boron powder or the like can be used as the antiadhesion agent.

As described above, according to another embodiment of the present invention, even when the liquid surface of the melted base 2 is rippled or disturbed by an external disturbance such as mechanical vibrations at the time of recrystallization of the semiconductor film 1 and hence the configuration of the semiconductor film 1 may be damaged, that damage can be prevented with pressing the semiconductor film 1 with the splint plate 12.

In addition, in the embodiments of the present invention, since the semiconductor film 1 is formed on the base 2 and, unlike the conventional example, the size of the semiconductor film 1 is not limited to the size of the substrate, a semiconductor film extending over a large area can be recrystallized in accordance with extension of the base 2.

In addition, in the embodiments of the present invention, although silicon is mainly used as a material of the semiconductor film 1 and a silicon dioxide film is mainly used as the isolation film 10 and the encapsulation film 11, the materials are not limited to the above and the same effects can be expected when a material having the same nature as that of the above materials is used.

In addition, although an infrared lamp heater is used as the heating means for melting and recrystallizing the semiconductor film 1 in the above embodiments, any means that supplies enough melt the semiconductor film 1 may be used.

In addition, although the method in which the semiconductor film 1 is partially melted and that molten part is moved is described in the above embodiments as a method of melting and recrystallization, another method such as a method in which the whole surface of the semiconductor film 1 is melted at the same time or the like can be used.

In addition, the recrystallized semiconductor film 1 may be used in semiconductor devices after being detached from the base 2. Since the base 2 is melted by the first heating means, it is quite easy to detach the semiconductor film 1 from the base 2. And further, the recrystallized semiconductor film 1 may be sequentially pulled and detached from the base 2 synchronously with the speed of the recrystallization of the semiconductor film 1.

As described above, according to the method of the present invention, a semiconductor film is melted and recrystallized on a base of a material having a melting point or softening temperature lower than that of the semiconductor material forming the semiconductor film. Therefore, generation of stress in the semiconductor film can be prevented or reduced and planarity of the semiconductor film is not damaged by distortion of the substrate, whereby the uniformity of the temperature in the semiconductor film is improved at the time of recrystallization. As a result, a recrystallized film with good crystallinity can be obtained. In addition, it is possible to melt and recrystallize the semiconductor film over a large area. In addition, by including an isolation film between the base and the semiconductor film, a component of the base or impurities contained in the base are prevented from diffusing into the semiconductor film, by using a splint plate on the semiconductor film, the planarity of the film is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a recrystallized semiconductor film comprising:
    forming a non-single crystal semiconductor film on a base having a melting point or softening temperature lower than the melting point of said semiconductor film;
    heating and melting said base with a first heating means; and
    melting said semiconductor film with a second heating means and recrystallizing said semiconductor film while said base is molten.

2. The method of claim 1 including forming an isolation film on said base and forming said semiconductor film on said isolation film, said isolation film preventing diffusion of a component of said base and impurities in said base into said semiconductor film.

3. The method of claim 1 including disposing a splint plate on said semiconductor film for maintaining the configuration of said semiconductor film when said semiconductor film is melted and recrystallized.

4. The method of claim 1 wherein said semiconductor film comprises silicon.

5. The method of claim 1 wherein said base comprises a material selected from the group consisting of aluminum, antimony, gallium, gold, silver, germanium, tin, copper, lead, an alloy of them, calcium chloride, potassium, chloride, and glass.

6. The method of claim 1 wherein said first and second heating means are selected from the group consisting of a carbon heater and an infrared lamp heater.

7. The method of claim 2 including disposing a splint plate on said semiconductor film for maintaining the configuration of said semiconductor film when said semiconductor film is melted and recrystallized.

8. The method of claim 2 wherein said isolation film comprises a silicon dioxide film.

9. The method of claim 3 wherein said splint plate is formed of a material selected from the group consisting of quartz, sapphire, and translucent alumina.

10. The method of claim 3 including placing an antiadhesion agent between said semiconductor film and said splint plate to prevent said semiconductor film from adhering to said splint plate.

11. The method of claim 10 wherein said antiadhesion agent is selected from the group consisting of silicon nitride, silicon carbide, and boron nitride.

12. The method of claim 3 wherein the surface of said splint plate directed toward said semiconductor film is embossed.

* * * * *

UNITED STATES PATENT AND TRADEMARK OFFICE
CERTIFICATE OF CORRECTION

PATENT NO. : 5,228,948

DATED : July 20, 1993

INVENTOR(S) : Mikio Deguchi

It is certified that error appears in the above-indentified patent and that said Letters Patent is hereby corrected as shown below:

Claim 5, column 10, line 23, change "potassium, chloride," to --potassium chloride--.

Signed and Sealed this

Third Day of May, 1994

*Attest:*

BRUCE LEHMAN

*Attesting Officer*    *Commissioner of Patents and Trademarks*